United States Patent
Bayer et al.

(10) Patent No.: US 11,646,666 B2
(45) Date of Patent: May 9, 2023

(54) DAISY CHAIN CLOCK DISTRIBUTION SYSTEM

(71) Applicant: TEXAS INSTRUMENTS INCORPORATED, Dallas, TX (US)

(72) Inventors: Erich-Johann Bayer, Freising (DE); Gerhard Thiele, Dachau (DE); Antonio Priego, Freising (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 86 days.

(21) Appl. No.: 17/317,101

(22) Filed: May 11, 2021

(65) Prior Publication Data

US 2021/0376731 A1 Dec. 2, 2021

Related U.S. Application Data

(60) Provisional application No. 63/031,814, filed on May 29, 2020.

(51) Int. Cl.
*H02M 3/158* (2006.01)
*H02M 1/00* (2006.01)
*H03K 5/24* (2006.01)

(52) U.S. Cl.
CPC ....... *H02M 3/1586* (2021.05); *H02M 1/0025* (2021.05); *H02M 1/0043* (2021.05); *H02M 1/0074* (2021.05); *H03K 5/24* (2013.01)

(58) Field of Classification Search
CPC ............. H02M 3/1586; H02M 1/0043; H02M 1/0025; H02M 1/0074; H03K 5/24
See application file for complete search history.

(56) References Cited

U.S. PATENT DOCUMENTS 11,190,105 B1 * 11/2021 Singhal ................... H02M 1/08

FOREIGN PATENT DOCUMENTS

CN 206759312 U * 12/2017 .............. H02J 9/061

OTHER PUBLICATIONS

Analog Devices, Adi Power By Linear; "5V, 10A Synchronous Step-Down Silent Switcher 2 in 3mm x 3mm LQFN"; Analog Devices, Inc. 2018-2020.
Parisi, Carmen; "Multiphase Buck Design From Start to Finish (Part 1)"; Application Report, Texas Instruments; Apr. 2017—Revised Apr. 2021.

* cited by examiner

*Primary Examiner* — Adolf D Berhane
(74) *Attorney, Agent, or Firm* — Ray A. King; Frank D. Cimino

(57) ABSTRACT

A circuit includes a first power converter having a first voltage input and a first output. The circuit also includes a second power converter having a second voltage input coupled to the first voltage input, a clock input, and a second output. A phase shifter is coupled between the first output and the clock input of the second power converter.

18 Claims, 9 Drawing Sheets

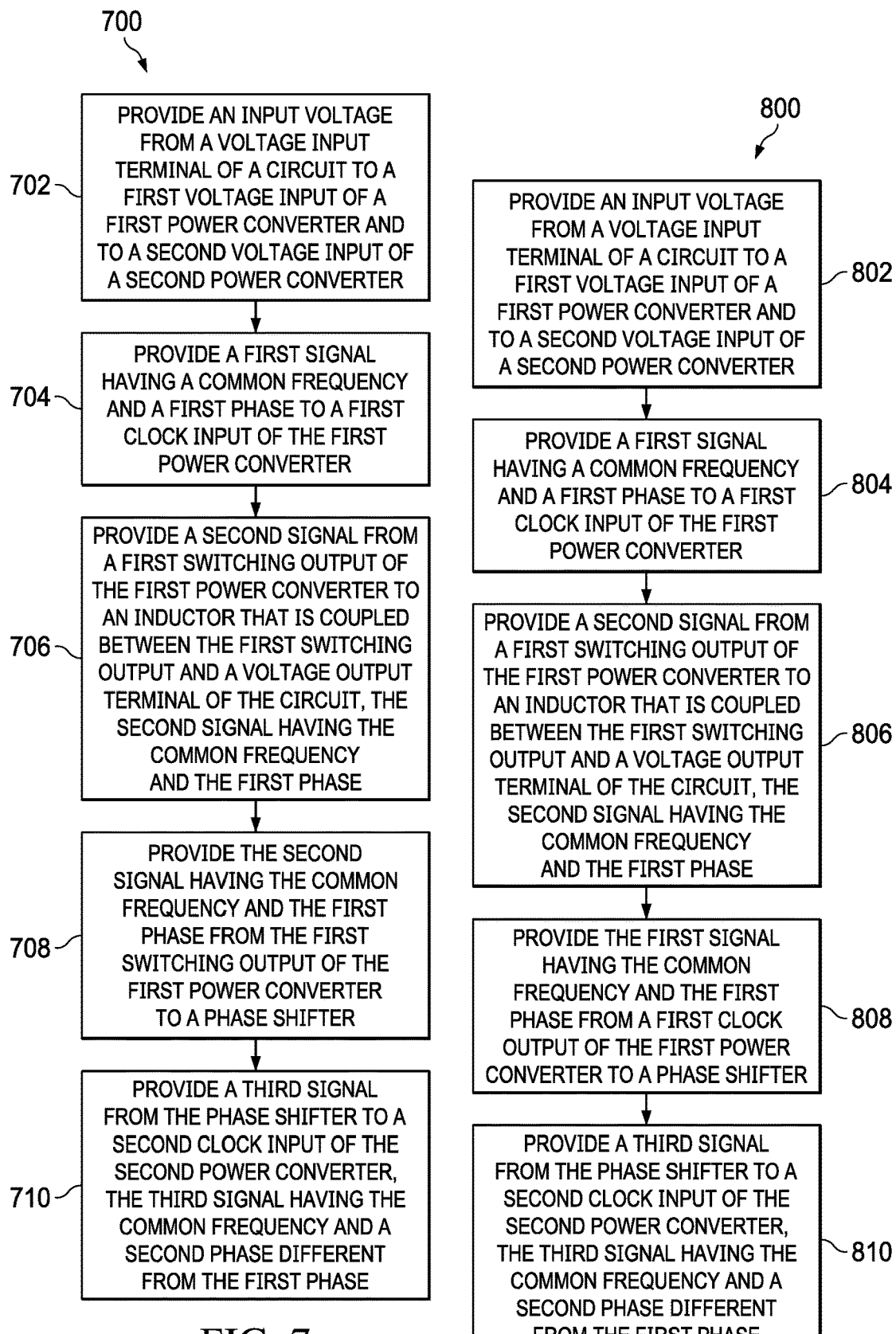

DAISY CHAIN CLOCK DISTRIBUTION SYSTEM

REFERENCE TO RELATED APPLICATION

This Application claims the benefit of U.S. Provisional Application No. 63/031,814, filed on May 29, 2020, the contents of which are hereby incorporated by reference in their entirety.

BACKGROUND

Direct current (DC)-to-DC converters and alternating current (AC)-to-DC converters, which may be referred to collectively as power converters, are widely employed in devices of today to perform power conversion. Generally, power converters receive a nominal voltage from a power source, such as a battery, and provide a regulated output voltage at one or more voltage levels. A variety of power converters and topologies can be employed to perform this power conversion. For example, buck converters, boost converters, and buck-boost converters are three basic types of power converter technologies.

SUMMARY

In one example, a circuit includes a first power converter having a first voltage input and a first output. The circuit also includes a second power converter having a second voltage input coupled to the first voltage input, a clock input, and a second output. A phase shifter is coupled between the first output and the clock input of the second power converter.

In another example, a circuit includes a first direct current power converter having a first voltage input, a first output, and a first feedback input coupled to the first output. A first inductor has a first inductor terminal and a second inductor terminal. The first inductor terminal is coupled to the first output. A second power converter has a second voltage input coupled to the first voltage input, and also has a clock input, a second output, and a second feedback input coupled to the first output. A second inductor has a third inductor terminal and a fourth inductor terminal. The third inductor terminal is coupled to the second output and the fourth inductor terminal is coupled to the second inductor terminal. A phase shifter is coupled between the first output and the clock input of the second power converter.

In another example, a circuit includes a first power converter having a first voltage input, a first switching output, a first clock output, and a first feedback input coupled to the first switching output. A first inductor has a first inductor terminal and a second inductor terminal. The first inductor terminal is coupled to the first switching output. A second power converter has a second voltage input coupled to the first voltage input, a clock input, a second switching output, and a second feedback input coupled to the first clock output. A second inductor has a third inductor terminal and a fourth inductor terminal. The third inductor terminal is coupled to the second switching output and the fourth inductor terminal is coupled to the second inductor terminal. A phase shifter is coupled between the first clock output and the clock input of the second power converter.

BRIEF DESCRIPTION OF THE DRAWINGS

FIGS. 7 and 8 are flow diagrams of some examples of methods for operating a multiphase regulator including a plurality of power converters.

DETAILED DESCRIPTION

Figure 1A:
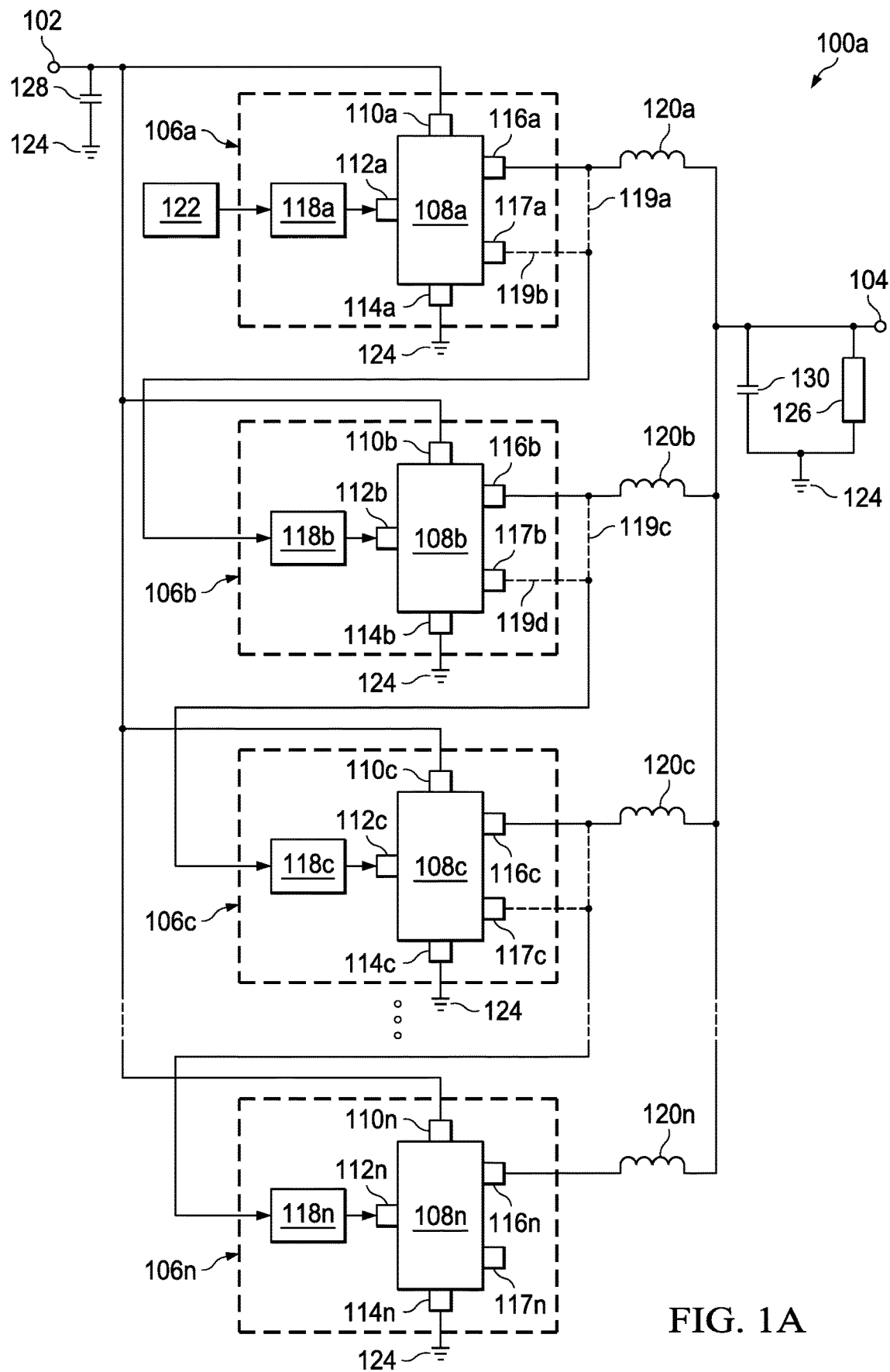
FIG. 1A is a diagram illustrating some examples of a circuit including a plurality of power converters arranged in a multiphase configuration.

Many modern devices include power electronics. For example, a device may include a multiphase regulator circuit that includes a plurality of power converters arranged in parallel with one another. The circuit may be used to convert an input voltage to an output voltage, and to maintain the output voltage at a set level independent of a load at the output of the regulator circuit. Because the power converters are arranged in parallel, they have respective inputs that are coupled to a common voltage input and have respective outputs that are coupled to a common voltage output.

In some instances, this voltage regulation is achieved by providing different clock signals to each of the power converters to turn the power converters on and off at different times. In such instances, the power converters operate with the same frequency as one another, but each power converter operates with a different phase from the other power converters. More particularly, this is achieved by inputting a common clock signal to each of the power converters in a parallel configuration, and by coupling different resistances to phase control pins of the various power converters to achieve the different phases. Each of the power converters receiving the common clock signal may include a phase-locked loop (PLL) to adjust the phase of the common clock to the phase set by the phase control pin.

A challenge with these multiphase regulator circuits is that because the phase control pins are required to set the phase of each of the power converters, a size of the power converters and/or a cost to produce the power converters on an integrated circuit (IC) may be increased. Also, because the number of pins for an integrated circuit is limited, it would be beneficial to eliminate the need for these phase control pins to free these pins up for other purposes. Further, because PLLs are required to adjust the phase of the common clock to the phase set by the phase control pins, a size of the power converter and/or a cost to produce the power converters used in the circuit may be further increased.

Various examples of the present description are related to a circuit including a clock distribution system that allows for reducing a size of the circuit and/or a cost of producing the circuit. The circuit includes a first power converter and a second power converter. The first power converter has a first voltage input and a first output. The second power converter has a second voltage input coupled to the first voltage input, a clock input, and a second output. A phase shifter is coupled between the first output and the clock input of the second power converter. In some cases, this clock distribution system may be referred to as having a "daisy chain" design, meaning that the power converters are coupled together in a sequence in which an output of one power converter in the sequence is coupled via a phase shifter to a clock input of the next power converter in the sequence.

By coupling the first output to the clock input of the second power converter through the phase shifter, a multiphase system may be created where the first power converter and the second power converter have a common clock frequency, but where the second power converter has a different phase than the first power converter without using an additional pin (e.g., a phase control pin) to set the phase of the clock at each power converter. As a result, a size of the circuit and/or a cost of producing the circuit may be reduced. Further, because the clock signals that are provided to the power converters have the desired frequency and phase for each power converter when provided to those power converters, a PLL may be eliminated from each of the power converters. Thus, the size of the circuit and/or the cost of producing the circuit may be further reduced.

FIG. 1A is a diagram illustrating some examples of a circuit 100a including a plurality of power converters 108a-108n arranged in a multiphase configuration.

As shown, the circuit 100a includes a first power converter 108a, a second power converter 108b, a third power converter 108c, and so on to an Nth power converter 108n. Each power converter 108a-108n has a respective voltage input (e.g., a first voltage input 110a through an Nth voltage input 110n), a respective clock input (e.g., a first clock input 112a through an Nth clock input 112n), a respective ground terminal (e.g., a first ground terminal 114a through an Nth ground terminal 114n), and a respective switching output (e.g., a first switching output 116a through an Nth switching output 116n). In some examples, each power converter 108a-108n additionally has a respective clock output (e.g., a first clock output 117a through an Nth clock output 117n).

In general, N can be any integer ranging from 2 to infinity, but in one example N ranges between 2 and 18. Also, inputs, outputs, and ground terminals are examples of conductors that allow electrical and/or mechanical coupling into or out of a circuit, circuit element, device, system, etc. Inputs, outputs, and ground terminals may be interchangeably referred to as input terminals, output terminals, and ground terminals. Also, a terminal may be interchangeably referred to as a pin where it is a point of connection to or from an IC chip or package, for instance.

Each voltage input 110a-110n is coupled to a voltage input terminal 102. The voltage input terminal 102 may be coupled to a voltage source (not shown). As such, each voltage input 110a-110n may receive an input voltage from the voltage source through the voltage input terminal 102. A load 126 is coupled between a voltage output terminal 104 and a reference voltage supply, which in this case is electrical ground 124. As shown, each ground terminal 114a-114n may receive a common reference voltage, such as electrical ground 124.

As further shown, inductors 120a-120n are coupled between each of the switching outputs 116a-116n and the voltage output terminal 104, respectively. More particularly, a first inductor 120a is coupled between switching output 116a and the voltage output terminal 104. A second inductor 120b is coupled between switching output 116b and the voltage output terminal 104. A third inductor 120c is coupled between switching output 116c and the voltage output terminal 104. An Nth inductor 120n is coupled between switching output 116n and the voltage output terminal 104. The illustrated circuit 100a is a buck converter, meaning the output voltage provided on the voltage output terminal 104 is less than the input voltage on the voltage input terminal 102, since each power converter has an inductor between the switching output and the voltage output terminal 104.

Phase shifters 118a-118n are respectively coupled to the clock inputs 112a-112n. More particularly, a first phase shifter 118a is coupled to the clock input 112a. A second phase shifter 118b is coupled to the clock input 112b. A third phase shifter 118c is coupled to the clock input 112c. An Nth phase shifter 118n is coupled to the clock input 112n.

In some examples, power converters 108a-108n are devoid of clock outputs 117a-117n. Accordingly, phase shifter 118a is coupled between a clock source 122 and clock input 112a. Phase shifter 118b is coupled between switching output 116a and clock input 112b (e.g., via connection 119a). Phase shifter 118c is coupled between switching output 116b and clock input 112c (e.g., via connection 119c), and so on.

In alternative examples, power converters 108a-108n have clock outputs 117a-117n. Accordingly, phase shifter 118a is coupled between a clock source 122 and clock input 112a. Phase shifter 118b is coupled between clock output 117a and clock input 112b (e.g., via connection 119b). Phase shifter 118c is coupled between clock output 117b and clock input 112c (e.g., via connection 119d), and so on.

In some examples, the circuit 100a is configured to operate as a multiphase buck regulator and each power converter 108a-108n is a switch mode DC-to-DC converter. In such examples, the circuit 100a is configured to convert an input DC voltage at the voltage input terminal 102 to an output DC voltage that is less than the input DC voltage at the voltage output terminal 104. The circuit 100a is further configured to regulate the output voltage at the voltage output terminal 104 independent of the load 126 applied at the voltage output terminal 104. This is achieved by providing different clock signals to each of the power converters to turn the power converters on and off at different times, thereby providing current to the different inductors at the different times. In other examples, each power converter 108a-108n is an AC-to-DC converter.

The clock source 122 provides a first signal (e.g., a clock signal) having a common frequency and a first phase to phase shifter 118a. Phase shifter 118a is configured to provide a second signal having the common frequency and a second phase, different from the first phase, to clock input 112a. In such examples, power converter 108a performs switching based on the second signal. In some other examples, a clock signal is not received from phase shifter 118a, and power converter 108a alternatively operates based an internal clock generated by an internal oscillator included in power converter 108a.

In some examples in which power converters 108a-108n are devoid of clock outputs 117a-117n, power converter 108a is configured to provide a third signal having the common frequency and the second phase from switching output 116a to inductor 120a and to phase shifter 118b. Phase shifter 118b is configured to provide a fourth signal having the common frequency and a third phase, different from the first phase and the second phase, to clock input 112*b*. Power converter 108*b* is configured to provide a fifth signal having the common frequency and the third phase from switching output 116*b* to inductor 120*b* and to phase shifter 118*c*. Phase shifter 118*c* is configured to provide a sixth signal having the common frequency and a fourth phase to clock input 112*c*, and so on through phase shifter 118*n*, power converter 108*n*, and inductor 120*n*.

In some other examples in which power converters 108*a*-108*n* additionally include clock outputs 117*a*-117*n*, power converter 108*a* is configured to provide a third signal having the common frequency and the second phase from switching output 116*a* to inductor 120*a*, and to provide a fourth signal having the common frequency and the second phase from clock output 117*a* to phase shifter 118*b*. Phase shifter 118*b* is configured to provide a fifth signal having the common frequency and the third phase, different from the first phase and the second phase, to clock input 112*b*. Power converter 108*b* is configured to provide a sixth signal having the common frequency and the third phase from switching output 116*b* to inductor 120*b*, and to provide a seventh signal having the common frequency and the third phase from clock output 117*b* to phase shifter 118*c*. Phase shifter 118*c* is configured to provide an eighth signal having the common frequency and the fourth phase to clock input 112*c*, and so on through phase shifter 118*n*, power converter 108*n*, and inductor 120*n*. In some examples, the fourth signal is the same as the second signal, and the seventh signal is the same as the fifth signal.

In some examples, each phase shifter 118*a*-118*n* is configured to shift a phase of a signal provided to that phase shifter by approximately 140 degrees, for instance by about 135 to 145 degrees, or by some other suitable value. For example, when the first phase is 0 degrees, the second phase is 140 degrees, the third phase is 280 degrees, and so on such that the Nth phase is equal to 140 degrees multiplied by N−1. As previously mentioned, in one example, N is an integer from 2-18, or some other suitable integer. In some instances, when N is equal to 19 or more, phases of different converters overlap. For example, a phase of the first power converter 108*a* and a phase of the 19$^{th}$ power converter overlap because 140 multiplied by 18 is equal to 2520 degrees, which is a multiple of 360 degrees. However, with a circuit of that many phases, any effect the phase overlap has on the circuit may be negligible. So as a practical example, consider a case where there is a second phase at 140 degrees (e.g., 140 degrees multiplied by 1) and a fourth phase at 420 degrees (e.g., 140 degrees multiplied by 3). Because the waveforms repeat every 360 degrees, the fourth phase of 420 degrees would actually appear as a phase shift of 60 degrees from zero degrees. As such, when comparing the second phase (e.g., that is a 140 degrees phase shift from zero) and the fourth phase (e.g., that is equivalent to a 60 degree phase shift from zero), these two would appear to have a phase difference of only 80 degrees between one another.

In some examples, power converters 108*a*-108*n* are separate integrated circuits, and switching outputs 116*a*-116*n* correspond to respective switching output pins and clock inputs 112*a*-112*n* correspond to respective clock input pins. By coupling each switching output pin to the subsequent clock input pin through the respective phase shifters, each power converter may receive the common clock frequency and respective phase without using an additional pin (e.g., a phase control pin) to set the phase of the clock signal at each power converter as practiced in other approaches. As a result, a size of the circuit and/or a cost of producing the circuit may be reduced compared to these other approaches. Further, while other approaches have included a separate PLL for each power converter, the present approach eliminates these PLLs. This is because the appropriate frequency and phase is provided to the clock input pin of each power converter, so there is no need for a PLL to adjust the phase of the clock signal at each power converter to the phase set by a phase control pin. Thus, the size of the circuit and/or the cost of producing the circuit may be further reduced.

In some examples, in the circuit of FIG. 1A, the power converters may automatically adjust to any changes in frequency at any converter without further input required. For example, if the first signal experiences a change in frequency, the subsequent signals reflect the change in frequency due to the serial design of the circuit 100*a* illustrated in FIG. 1A. Thus, a performance of the circuit may be improved. This may be useful for many different applications such as, for example, spread-spectrum operation or the like.

In some examples, a phase shifter and its respective power converter are included in a single integrated circuit and/or a single package. For example, in such examples, the phase shifter 118*a* and the power converter 108*a* are both included in a first package 106*a*. The phase shifter 118*b* and the power converter 108*b* are both included in a second package 106*b*. The phase shifter 118*c* and the power converter 108*c* are both included a third package 106*c*. The phase shifter 118*n* and the power converter 108*n* are both included in an Nth package 106*n*. In some examples, the different individual packages are coupled together as illustrated in FIG. 1A to assemble the circuit 100*a* of FIG. 1A. Such an approach with N packages allows the inductors, which often consume large areas on an integrated circuit, to be realized as discrete inductors and allows for better heat dissipation due to the larger area of the multiple packages. Thus, this example with N packages provides a solution that offers good reliability at a reasonable cost.

In one example, the clock source 122 is an external clock generator, such as an oscillator including a resonant circuit and an amplifier, or some other suitable clock source. For instance, the resonant circuit can include a quartz and/or piezo-electric oscillator, a resistor-capacitor (RC) oscillator, a ring oscillator, or other resonant circuits.

In an example, each phase shifter is or includes a resistor-capacitor (RC) time delay circuit including one or more resistors coupled to one or more capacitors. The time delay circuit may further include one or more comparators.

The circuit 100*a* includes an input capacitor 128 coupled between the voltage input terminal 102 and electrical ground 124. The circuit 100*a* further includes an output capacitor 130 coupled between the voltage output terminal 104 and electrical ground 124 and coupled in parallel with a load 126. Although only one input capacitor 128 and one output capacitor 130 are shown, the circuit 100*a* may include additional input and/or output capacitors. The load 126 may be a low-voltage and high-current device that includes hardware or a combination of hardware and software, or may be another type of load. For example, the load 126 can include any load which consumes current at a given voltage such as a resistor, a current sink, a microcontroller, a field programmable gate array (FGPA), and/or a light emitting diode (LED), among others.

In some examples, the voltage source (not shown) includes a power supply, a battery, or some other suitable voltage source. For example, the voltage source is a lithium ion battery.

In some examples, the circuit of FIG. 1A is utilized in a number of different technologies such as, for example, camera technology, sensor technology, digital cockpit technology, storage technology, optical network and communications technology, core supply technology, or the like. Further, the circuit can increase performance and reduce costs, compared to other approaches. For example, in some cameras and sensors, the circuit of FIG. 1A provides a small package and a 1% gain in accuracy of the sensors and/or camera, and can reduce costs by eliminating the need for external feedback voltage resistors as were present in some previous approaches.

Figure 1B:
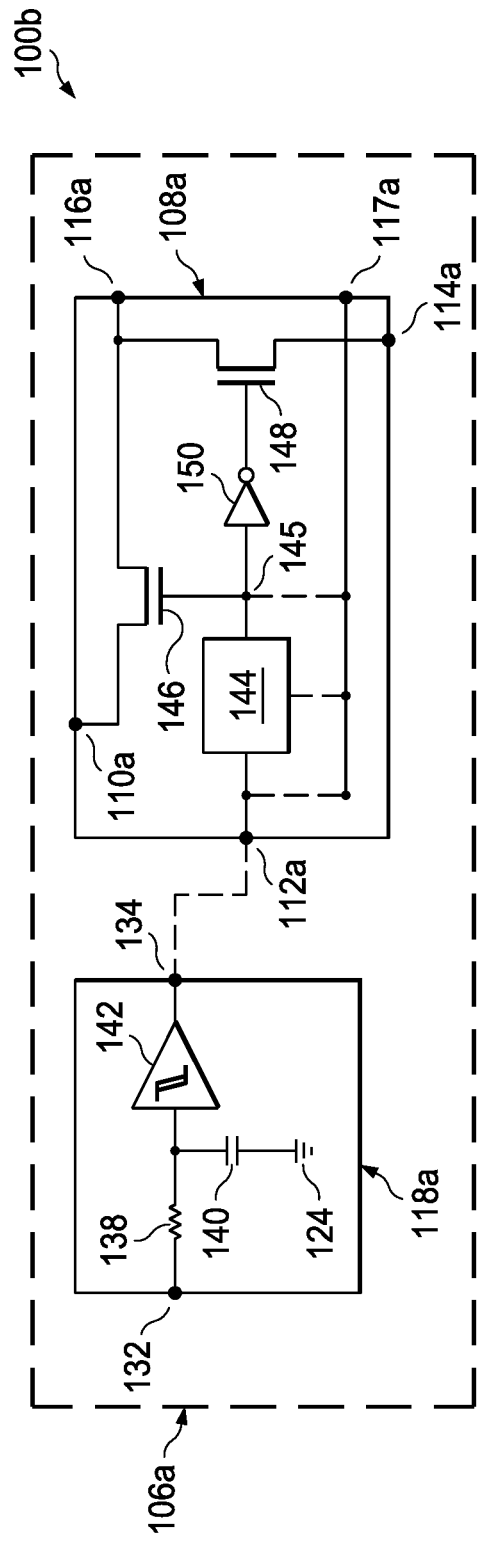
FIG. 1B illustrates a circuit showing an example implementation of a package including a phase shifter and a power converter of FIG. 1A.

FIG. 1B illustrates a circuit 100b showing an example implementation of a package 106a including the phase shifter 118a and the power converter 108a of FIG. 1A. Each package 106a-106n may be similarly implemented.

As shown, phase shifter 118a includes a resistor 138, a comparator 142, and a capacitor 140. The resistor 138 has a first resistor terminal coupled to an input 132 of the phase shifter, and a second resistor terminal coupled to a comparator input of the comparator 142. The comparator has a comparator output coupled to an output 134 of phase shifter 118a. A first capacitor terminal of capacitor 140 is coupled to the second resistor terminal and the input of the comparator 142. A second terminal of the capacitor 140 is coupled to electrical ground 124. In one example, the comparator 142 is or includes a Schmitt trigger, but may alternatively be or include any suitable comparator topology.

In some examples, power converter 108a includes switch control circuitry 144, a first transistor 146, a second transistor 148, and an inverter 150. Each transistor includes a control terminal, and first and second transistor terminals. Transistor 146 has a first transistor terminal coupled to the voltage input 110a, a second transistor terminal coupled to the switching output 116a, and a control terminal coupled to input 145 of inverter 150. Transistor 148 has a first transistor terminal coupled to switching output 116a, a second transistor terminal coupled to ground terminal 114a, and a control terminal coupled to the output of inverter 150. The switch control circuitry 144 has an input coupled to clock input 112a and an output coupled to the control terminals of transistor 146 and transistor 148. The inverter 150 has an input coupled to an output of the switch control circuitry 144 and to the control terminal of the transistor 148. In some examples, the switch control circuitry 144 includes one or more amplifiers, modulators, driver circuits, or some other suitable circuitry. Though FIG. 1B illustrates transistors consistent with a circuit symbol for a metal-oxide-semiconductor-field-effect transistor (MOSFET). However, other transistors, such as bipolar junction transistors (BJTs), finFETs, and/or junction-FETs, among others, could also be used.

In some examples, power converter 108a may additionally have the clock output 117a. The clock output 117a is coupled to clock input 112a, to the switch control circuitry 144, or to an output of the switch control circuitry 144 (e.g., through any one of the dashed connections).

In some examples in which power converter 108a is devoid of clock output 117a, the input 145 of the inverter 150 is coupled to switching output 116a. In some examples in which power converter 108a additionally has clock output 117a, the input 145 of inverter 150 is coupled to switching output 116a and to clock output 117a.

In some examples, inductor 120a of FIG. 1A is coupled to the input 145 of the inverter 150 via switching output 116a. In some examples in which the power converter 108a is devoid of the clock output 117a, phase shifter 118b of FIG. 1A is coupled to the input 145 of inverter 150 via switching output 116a. In some examples in which power converter 108a additionally has clock output 117a, phase shifter 118b of FIG. 1A is alternatively coupled to the input 145 of inverter 150 via clock output 117a.

In some examples, a phase shifted clock signal is provided to the switch control circuitry 144 of power converter 108a through clock input 112a. The switch control circuitry 144 may, for example, modify the phase shifted clock signal (e.g., amplify the signal or perform some other operation) and provide a control signal (e.g., 234 of FIG. 2), that is based on the phase shifted clock signal, to a control terminal of the transistor 146 and to a control terminal of the transistor 148 through the inverter 150.

In some examples, when the control signal goes high, transistor 146 turns on and transistor 148 turns off, which pulls up the voltage at switching output 116a (e.g., to the input voltage at the voltage input 110a) and which isolates switching output 116a from ground terminal 114a. In some examples, when the control signal goes low, transistor 146 turns off and transistor 148 turns on, which pulls down the voltage at switching output 116a (e.g., to ground) and which isolates switching output 116a from voltage input 110a.

Figure 2:
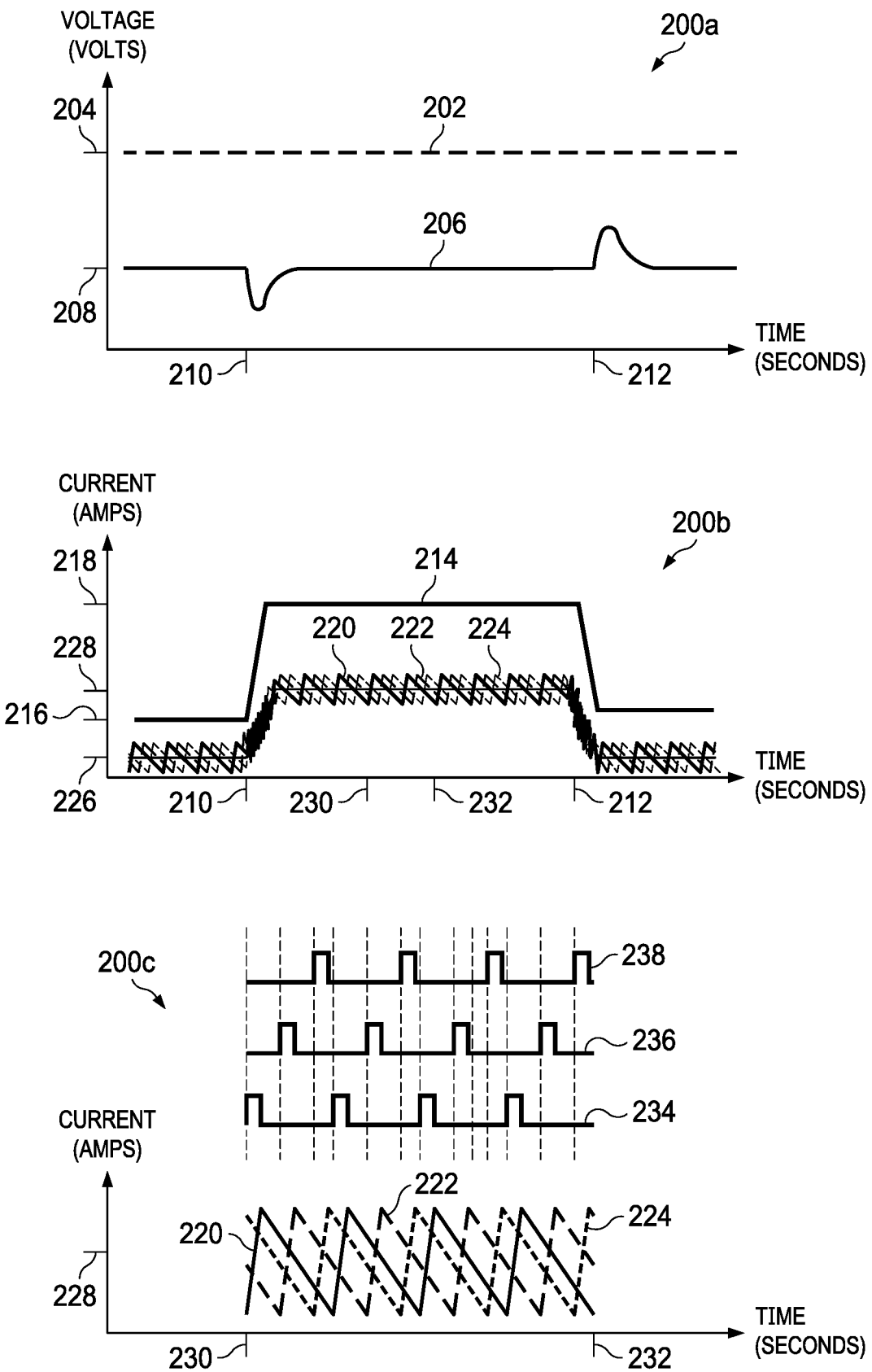
FIG. 2 illustrates graphs of some examples of signals of a multiphase regulator circuit that is arranged in a three-phase configuration.

FIG. 2 illustrates graphs 200a-200c of some examples of signals of a multiphase regulator circuit (e.g., like that of FIG. 1A) that is arranged in a three-phase configuration (e.g., having three power converters).

Graph 200a illustrates an input voltage signal 202 having a first magnitude 204 and an output voltage signal 206 having a second magnitude 208. In the illustrated example, which may be referred to in some cases as a "buck" converter, the second magnitude 208 is less than the first magnitude 204. In some other examples (not shown), which may be referred to in some cases as a "boost" converter, the second magnitude 208 is greater than the first magnitude 204.

The input voltage signal 202 is provided at a voltage input terminal (e.g., 102 of FIG. 1A) of the circuit by a voltage source, and the output voltage signal 206 is provided at a voltage output terminal (e.g., voltage output terminal 104 of FIG. 1A). The input voltage signal 202 is provided from the voltage input terminal to a first voltage input (e.g., 110a of FIG. 1A) of a first power converter (e.g., 108a of FIG. 1A), a second voltage input (e.g., 110b of FIG. 1A) of a second power converter (e.g., 108b of FIG. 1A), and a third voltage input (e.g., 110c of FIG. 1A) of a third power converter (e.g., 108c of FIG. 1A).

Graph 200b illustrates a load current 214 and inductor currents (e.g., a first inductor current 220, a second inductor current 222, and a third inductor current 224). Thus, these inductor currents are an example of switching output signals provided at switching outputs 116a-116n in FIG. 1A. In some examples, because the example illustrated in FIG. 2 is a three-phase configuration, the magnitude of a DC component (e.g., 226 and 228) of each inductor current is equal to one third of the magnitude of the load current 214 (e.g., 216 and 218, respectively). As a result, the sum of the DC components of each inductor current is equal to the load current 214, such that Kirchhoff's Current Law is satisfied at a voltage output terminal (e.g., voltage output terminal 104 of FIG. 1A) of the circuit where the load is coupled to the inductors.

In some examples, the AC components of the inductor currents are absorbed by an output capacitor (e.g., 130 of FIG. 1A) that is coupled in parallel with the load (e.g., 126 of FIG. 1A). In other words, the output capacitor coupled in parallel with the load may act as a low pass filter.

In some examples, the load current changes over time. For example, the load current 214 changes at a first time 210 and again at a second time 212. As a result, the output voltage 206 may spike or drop briefly following the first time 210 and the second time 212. Further, the inductor currents change in magnitude following the change in the load current 214 in order to satisfy Kirchhoff's Current Law.

Graph 200c illustrates the first inductor current 220, the second inductor current 222, and the third inductor current 224 from a third time 230 to a fourth time 232. The magnitude of the DC component of each of the inductor currents (e.g., 228) is equal to one third of the magnitude of the load current 214 (e.g., 218). Further, each of the inductor currents have different phases. For example, the first inductor current 220 depends on a first control signal 234 that is provided to the first power converter, the second inductor current 222 depends on a second control signal 236 that is provided to the second power converter, and the third inductor current 224 depends on a third control signal 238 that is provided to the third power converter.

For example, the first control signal 234 is generated by switch control circuitry (e.g., 144 of FIG. 1B) of a first power converter (e.g., 108a of FIG. 1A or FIG. 1B) based on a clock signal received by the first power converter. For example, the switch control circuitry of the first power converter generates the first control signal 234 so the first control signal 234 has a same frequency and phase as the clock signal received by the first power converter. The first control signal 234 is provided from the switch control circuitry of the first power converter to a first transistor (e.g., 146 of FIG. 1B) and a second transistor (e.g., 148 of FIG. 1B) of the first power converter to control the first and second transistors. Similarly, the second control signal 236 is generated by switch control circuitry of a second power converter (e.g., 108b of FIG. 1A) based on a clock signal received by the second power converter, for example, from a phase shifter (e.g., 118b of FIG. 1A). For example, the switch control circuitry of the second power converter generates the second control signal 236 so the second control signal 236 has a same frequency and phase as the clock signal received by the second power converter. The second control signal 236 is provided from the switch control circuitry of the second power converter to a first transistor and a second transistor of the second power converter to control the first and second transistors. Further, the third control signal 238 is generated by switch control circuitry of a third power converter (e.g., 108c of FIG. 1A) based on a clock signal received by the third power converter, for example, from a phase shifter (e.g., 118c of FIG. 1A). For example, the switch control circuitry of the third power converter generates the third control signal 238 so the third control signal 238 has a same frequency and phase as the clock signal received by the third power converter. The third control signal 238 is provided from the switch control circuitry of the third power converter to a first transistor and a second transistor of the third power converter to control the first and second transistors.

In some examples, each of the control signals have a common frequency. In some examples, a phase of the second control signal 236 differs from a phase of the first control signal 234 by about 140 degrees, and a phase of the third control signal 238 differs from the phase of the second control signal 236 by about 140 degrees (e.g., the phase of the first control signal 234 is 0 degrees, the phase of the second control signal 236 is 140 degrees, and the phase of the third control signal 238 is 280 degrees).

In some examples, the first control signal 234 is based on (e.g., has a same frequency and phase as) a first clock signal that is provided to the first power converter by a first phase shifter (e.g., 118a of FIG. 1A). In some alternative examples, the first control signal 234 is based on (e.g., has a same frequency and phase as) a first clock signal that is generated by an internal clock signal of the first power converter. In some examples, the second control signal 236 is based on (e.g., has a same frequency and phase as) a second clock signal that is provided to the second power converter from an output of the first power converter, and the third control signal 238 is based on (e.g., has a same frequency and phase as) a third clock signal that is provided to the third power converter from an output of the second power converter (e.g., as illustrated in FIG. 1A).

The graphs 200a-200c of FIG. 2 illustrate the circuit having a buck configuration. However, it will be appreciated that the circuit may alternatively be configured to operate as a boost regulator or a buck-boost regulator.

Figure 3:
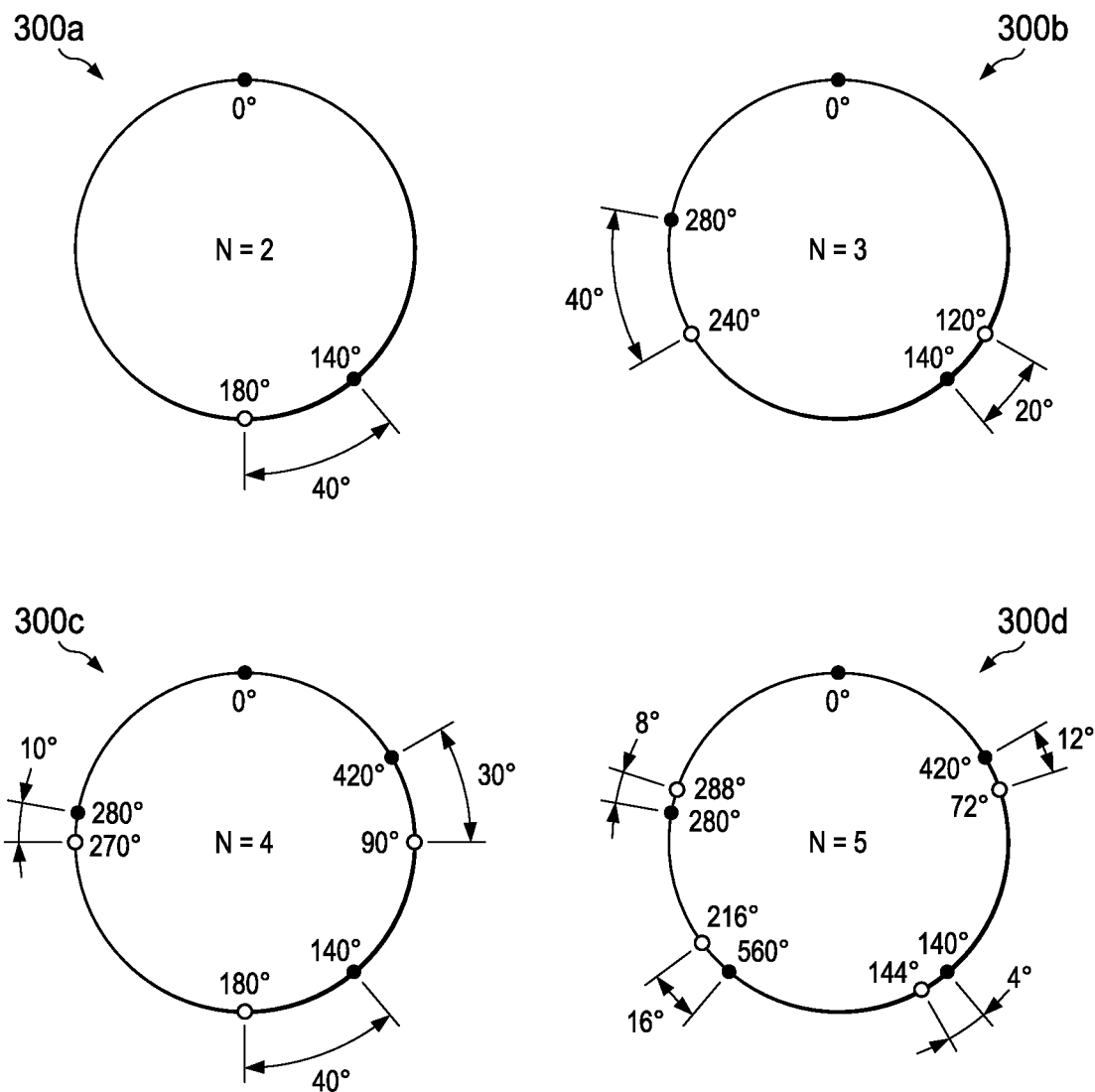
FIG. 3 illustrates diagrams of some examples of phase shift configurations of power converters of a multiphase regulator circuit.

FIG. 3 illustrates diagrams 300a-300d of some examples of phase shift configurations of power converters of a multiphase regulator circuit.

In some examples, when using 140 degrees as the phase shift constant in the circuit of FIG. 1A, the maximum phase offset relative to a circuit that has phases which are evenly spaced around the unit circle is about 40 degrees or less, regardless of the number of phases in the circuit (e.g., regardless of N).

For example, in a two phase configuration (e.g., as illustrated by diagram 300a), the first power converter operates at a reference phase (e.g., zero degrees), and the second power converter operates at a 140 degrees phase shift relative to the reference phase. Thus, the maximum phase offset of any one of the phases relative to phases of a two phase configuration that has phases which are evenly spaced around the unit circle (e.g., 0 degrees and 180 degrees) is 40 degrees.

In a three phase configuration (e.g., as illustrated by diagram 300b), the first power converter operates at a reference phase (e.g., zero degrees). The second power converter operates at a 140 degrees phase shift relative to the reference phase (e.g., the second power converter operates at approximately 140 degrees). The third power converter operates at a 140 degree phase shift relative to the phase of the second power converter (e.g., the third power converter operates at approximately 280 degrees). Thus, the maximum phase offset of any one of the phases relative to phases of a three phase configuration that has phases which are evenly spaced around the unit circle (e.g., 0 degrees, 120 degrees, and 240 degrees) is 40 degrees.

In a four phase configuration (e.g., as illustrated by diagram 300c), the first power converter operates at a reference phase (e.g., zero degrees). The second power converter operates at a 140 degrees phase shift relative to the reference phase (e.g., the second power converter operates at approximately 140 degrees). The third power converter operates at a 140 degree phase shift relative to the phase of the second power converter (e.g., the third power converter operates at approximately 280 degrees). The fourth power converter operates at a 140 degree phase shift relative to the phase of the third power converter (e.g., the fourth power converter operates at approximately 420 degrees). Thus, the maximum phase offset of any one of the phases relative to phases of a four phase configuration that has phases which are evenly spaced around the unit circle (e.g., 0 degrees, 90 degrees, 180 degrees, and 270 degrees) is 40 degrees.

In a five phase configuration (e.g., as illustrated by diagram 300d), the first power converter operates at a reference phase (e.g., zero degrees). The second power converter operates at a 140 degrees phase shift relative to the reference phase (e.g., the second power converter operates at approximately 140 degrees). The third power converter operates at a 140 degree phase shift relative to the phase of the second power converter (e.g., the third power converter operates at approximately 280 degrees). The fourth power converter operates at a 140 degree phase shift relative to the phase of the third power converter (e.g., the fourth power converter operates at approximately 420 degrees). The fifth power converter operates at a 140 degree phase shift relative to the phase of the fourth power converter (e.g., the fifth power converter operates at approximately 560 degrees). Thus, the maximum phase offset of any one of the phases relative to phases of a five phase configuration that has phases which are evenly spaced around the unit circle (e.g., 0 degrees, 72 degrees, 144 degrees, 216 degrees, and 288 degrees) is 16 degrees.

By providing a 140 degree phase shift to each additional phase, a maximum phase offset of an N phase configuration (e.g., where N is 2 to 18) is limited to 40 degrees. Thus, a performance of the circuit may be maintained independent of the number of phases of the circuit.

Figure 4:
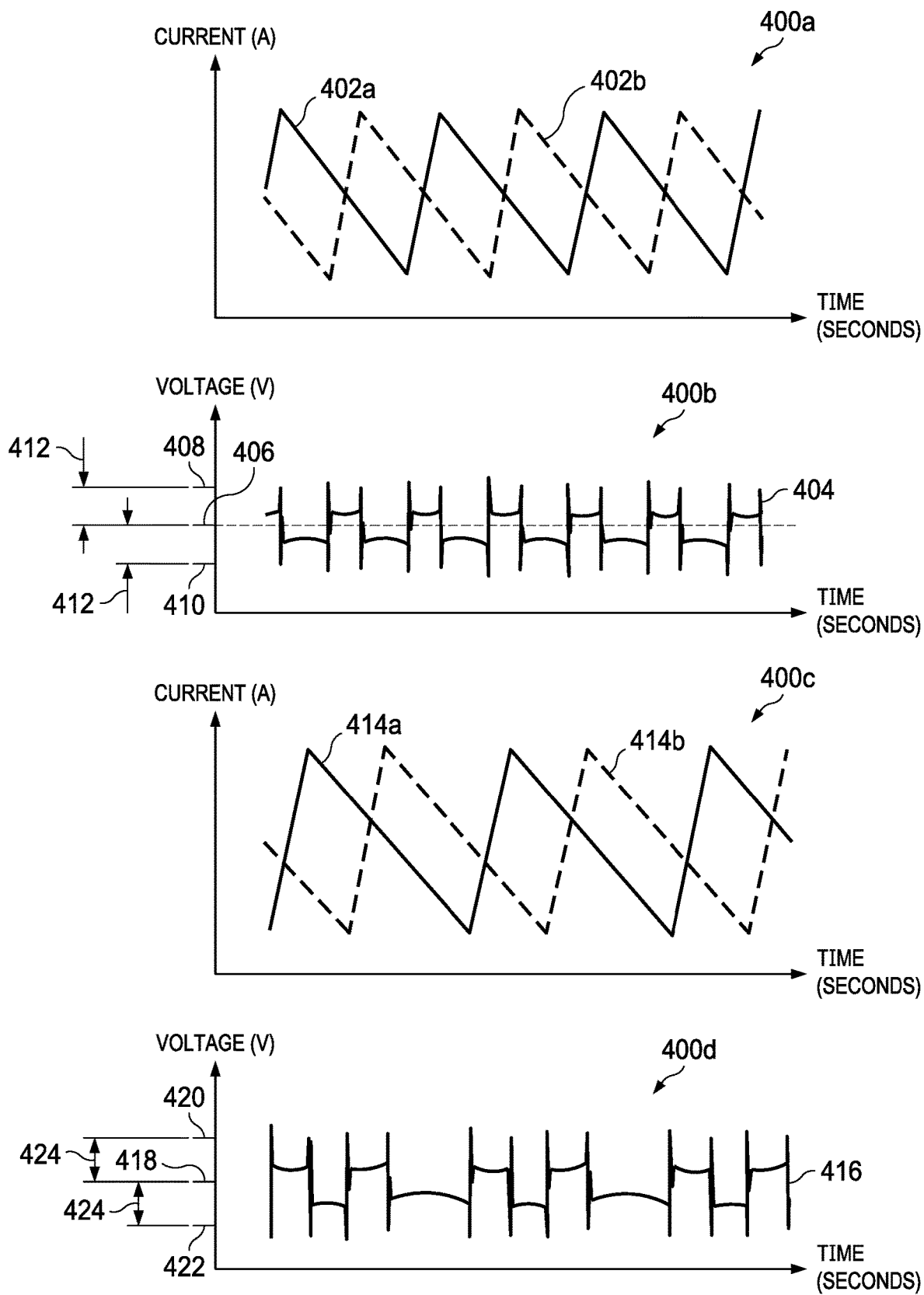
FIG. 4 illustrates graphs of some examples of signals of a multiphase regulator circuit that is arranged in a two-phase configuration.

FIG. 4 illustrates graphs 400a-400d of some examples of signals of a multiphase regulator circuit (e.g., like that of FIG. 1A) that is arranged in a two-phase configuration (e.g., having two power converters).

In particular, graph 400a illustrates two current signals, a first inductor current 402a passing through a first inductor (e.g., inductor 120a of FIG. 1A) and a second inductor current 402b passing through a second inductor (e.g., inductor 120b of FIG. 1A). In graph 400a, the phase difference between the first inductor current 402a and the second inductor current 402b is 180 degrees (e.g., the phases are evenly spaced around the unit circle).

Graph 400b illustrates a first output voltage signal 404 at a voltage output terminal of the circuit (e.g., voltage output terminal 104 of FIG. 1A) to which the first inductor and the second inductor provide current. The first output voltage signal 404 has a first average value 406, a first upper peak value 408, and a first lower peak value 410. The first output voltage signal 404 has a first voltage ripple 412 (e.g., a difference between the first upper peak value 408 and the first average value 406, or a difference between the first lower peak value 410 and the first average value 406).

Graph 400c illustrates two alternative current signals, a third inductor current 414a passing through the first inductor (e.g., inductor 120a of FIG. 1A) and a fourth inductor current 414b passing through the second inductor (e.g., inductor 120b of FIG. 1A). In graph 400c, the phase difference between the third inductor current 414a and the fourth inductor current 414b is 140 degrees.

Graph 400d illustrates a second output voltage signal 416 at the voltage output terminal of the circuit to which the first inductor and the second inductor provide current. The second output voltage signal 416 has a second average value 418, a second upper peak value 420, and second lower peak value 422. The second output voltage signal 416 has a second voltage ripple 424 (e.g., a difference between the second upper peak value 420 and the second average value 418, or a difference between the second lower peak value 422 and the second average value 418).

In some examples, the second voltage ripple 424 is approximately equal to the first voltage ripple 412. Thus, a performance of the two phase regulator circuit operating with a phase shift of 140 degrees may be comparable to a performance of the two phase regulator circuit operating with a phase shift of 180 degrees.

Figure 5B:
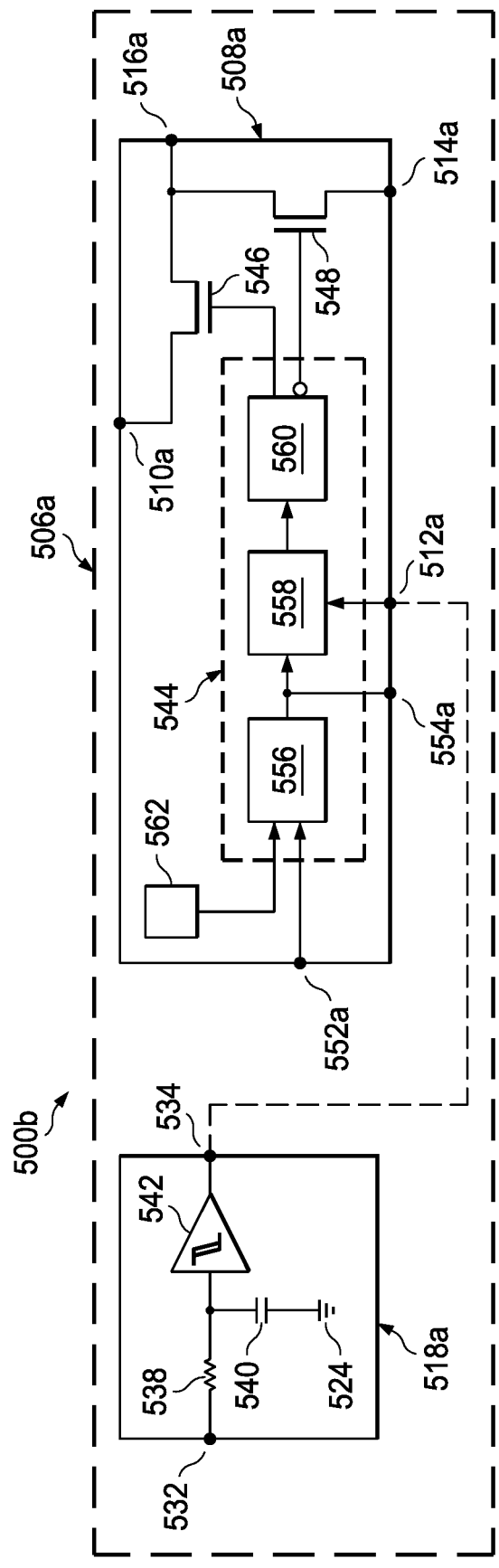
FIG. 5B illustrates a circuit showing an example implementation of a package including a phase shifter and a power converter of FIG. 5A.
Figure 5A:
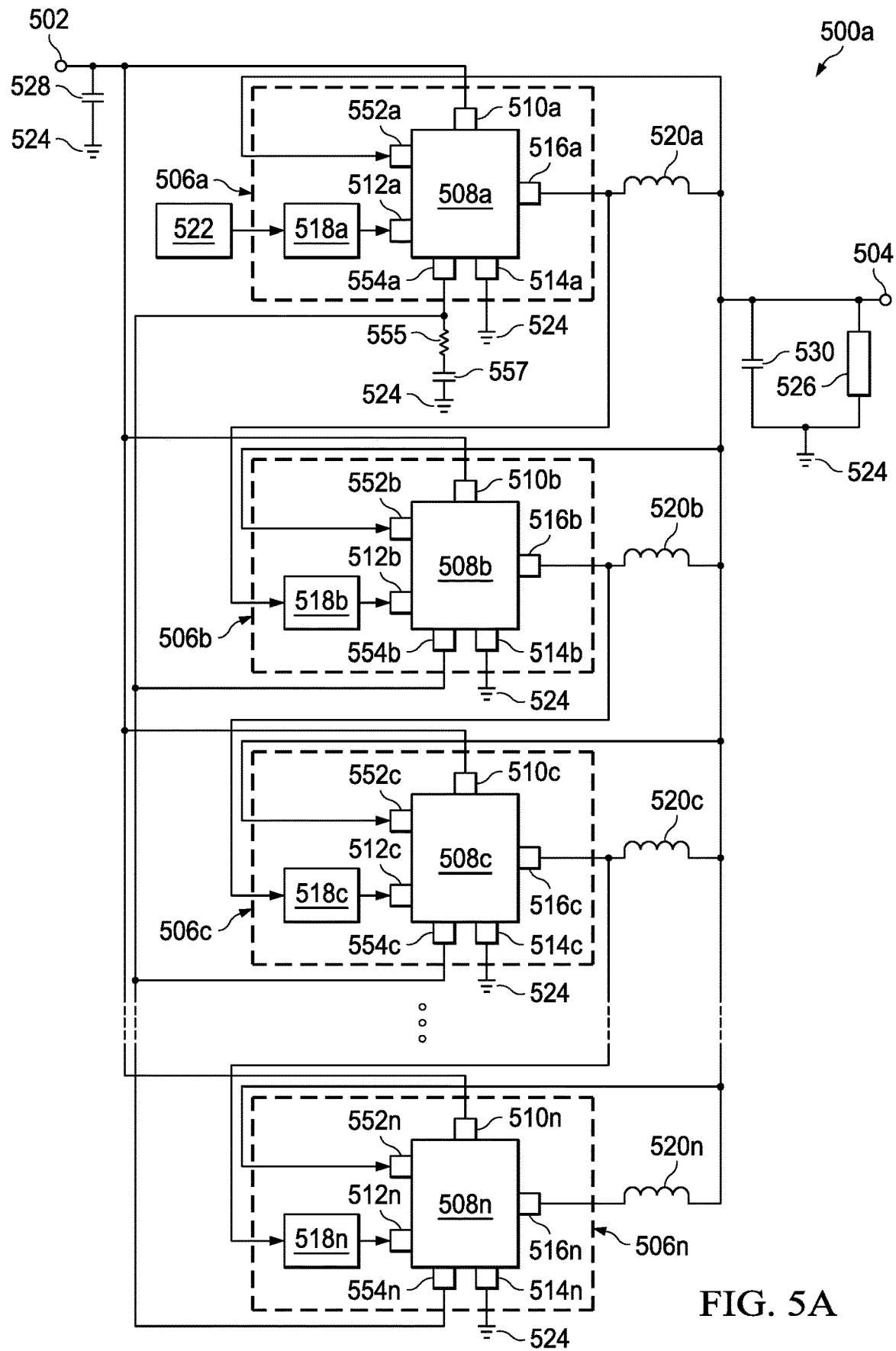
FIG. 5A is a diagram illustrating some examples of a circuit in which each power converter has a feedback input and a compensation terminal.

FIG. 5A is a diagram illustrating some examples of a circuit 500a including power converters 508a-508n each further having a respective feedback input (e.g., a first feedback input 552a through an Nth feedback input 552n) and a respective compensation terminal (e.g., a first compensation terminal 554a through an Nth compensation terminal 554n). Similar to power converters 108a-108n in circuit 100a of FIG. 1A, each power converter 508a-508n in the circuit 500a of FIG. 5A has voltage inputs 510a-510n, clock inputs 512a-512n, ground terminals 514a-514n, and switching outputs 516a-516n, respectively, that are coupled as shown. In addition, similar to circuit 100a to FIG. 1A, the circuit 500a of FIG. 5A includes a voltage input terminal 502, a voltage output terminal 504, a clock source 522, phase shifters 518a-518n, inductors 520a-520n, an input capacitor 528, an output capacitor 530, an output load 526, and an electrical ground 524 that are coupled as shown. In some examples, the circuit 500a of FIG. 5A includes separate integrated circuit packages 506a-506n, while in other examples the circuit 500a of FIG. 5A can be disposed in a monolithic integrated circuit.

In some examples, each feedback input 552a-552n is coupled to the voltage output terminal 504 and can receive an output voltage from the voltage output terminal 504. Voltage inputs 510a-510n are coupled to the voltage input terminal 502. In some examples, compensation terminals 554a-554n are coupled together. In some examples, a compensation resistor 555 and a compensation capacitor 557 are coupled in series between compensation terminals 554a-554n and electrical ground 524. The arrangement of FIG. 5A is applicable to "boost", "buck", and "boost/buck" topologies, and for example, the circuitry of FIG. 5A can be used for power converters 508a-508n to realize a "buck" converter topology.

FIG. 5B illustrates a circuit 500b showing an example implementation of a package 506a including phase shifter 518a and power converter 508a of FIG. 5A. Each package 506a-506n of FIG. 5A may be similarly implemented.

Similar to phase shifter 118a of FIG. 1B, phase shifter 518a of FIG. 5B includes a phase shifter input 532, a resistor 538, a capacitor 540, a comparator 542, a phase shifter output 534, and electrical ground 524 that are coupled as shown. Similar to power converter 108a of FIG. 1B, power converter 508a of FIG. 5B includes a first clock input 512a, a first voltage input 510a, a first switching output 516a, a first ground terminal 514a, switch control circuitry 544, a first transistor 546, and a second transistor 548 that are coupled as shown. Power converter 508a further includes feedback input 552a and compensation terminal 554a that are coupled as shown.

Feedback input 552a and compensation terminal 554a are coupled to the switch control circuitry 544 of power converter 508a. In some examples, the switch control circuitry 544 includes an error amplifier 556, a modulator 558 (e.g., a pulse width modulation comparator or the like), and a control terminal driver 560. In some examples, an internal reference voltage source 562 and feedback input 552a are coupled to inputs of the error amplifier 556. An output of the error amplifier 556 is coupled to an input of the modulator 558. The output of the error amplifier 556 is also coupled to compensation terminal 554a. Clock input 512a is coupled to an input of the modulator 558. An output of the modulator 558 is coupled to an input of the control terminal driver 560. Outputs of the control terminal driver 560 are coupled to control terminals of transistor 546 and transistor 548.

In some examples, the error amplifier 556 compares a reference voltage from the internal reference voltage source 562 to the output voltage at the feedback input 552a and outputs a voltage error signal. The voltage error signal is provided to compensation terminal 554a. The voltage error signal and a clock signal are provided to the modulator 558 from the error amplifier 556 and from clock input 512a, respectively. The modulator 558 compares the voltage error signal to a ramp waveform that is based on the clock signal. The modulator 558 outputs a duty cycle signal, which is based on the clock signal, to the control terminal driver 560. The control terminal driver 560 outputs control signals from a non-inverting output and from an inverting output to a control terminal of transistor 546 and to a control terminal of transistor 548, respectively.

Figure 6A:
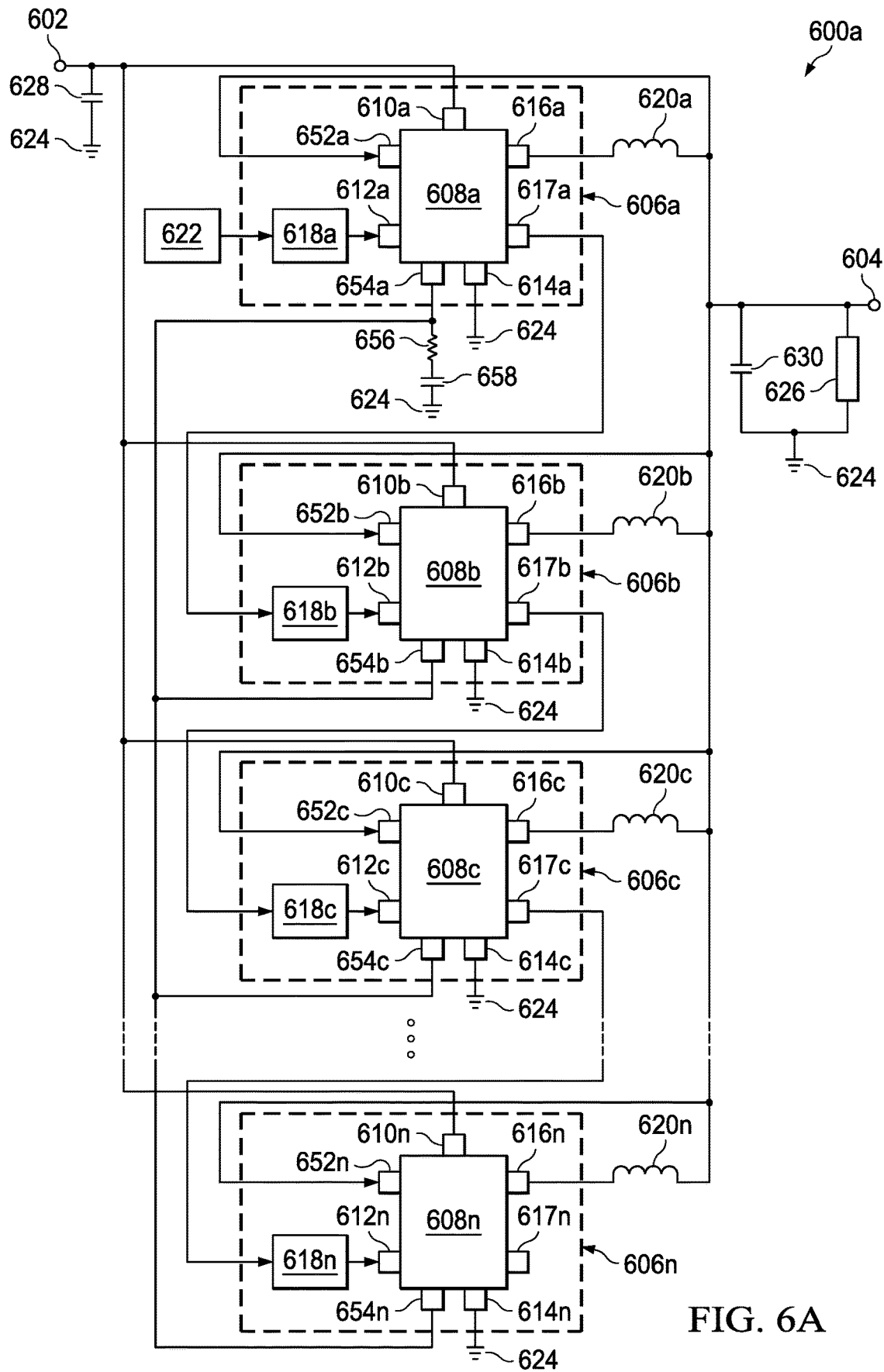
FIG. 6A is a diagram illustrating some examples of a circuit in which each power converter has a clock output.

FIG. 6A is a diagram illustrating some examples of a circuit 600a including power converters 608a-608n each further having a respective clock output (e.g., a first clock output 617a through an Nth clock output 617n). Similar to power converters 508a-508n in circuit 500a of FIG. 5A, each power converter 608a-608n in the circuit 600a of FIG. 6A has voltage inputs 610a-610n, clock inputs 612a-612n, ground terminals 614a-614n, switching outputs 616a-616n, feedback inputs 652a-652n, and compensation terminals 654a-654n, respectively, that are coupled as shown. In addition, similar to circuit 500a to FIG. 5A, the circuit 600a of FIG. 6A includes a voltage input terminal 602, a voltage output terminal 604, a clock source 622, phase shifters 618a-618n, inductors 620a-620n, an input capacitor 628, an output capacitor 630, an output load 626, and electrical ground 624 that are coupled as shown. In some examples, the circuit 600a of FIG. 6A includes separate integrated circuit packages 606a-606n, while in other examples the circuit 600a of FIG. 6A can be disposed in a monolithic integrated circuit.

For example, power converter 608a includes a first clock output 617a. Power converter 608b includes a second clock output 617b. Power converter 608c includes a third clock output 617c. Power converter 608n includes an Nth clock output 617n. Clock outputs 617a-617n are separate from switching outputs 616a-616n of the power converters. In some examples, clock outputs 617a-617n are coupled to respective clock inputs 612a-612n of respective power converters 608a-608n. For example, clock input 612a is coupled to clock output 617a; clock input 612b is coupled to clock output 617b; and so on.

Clock output 617a is coupled to phase shifter 618b; clock output 617b is coupled to the phase shifter 618c; and so on. The clock source 622 is configured to provide a first signal having a common frequency and a first phase to first phase shifter 618a. Phase shifter 618a is configured to provide a second signal having the common frequency and a second phase to clock input 612a. Power converter 608a is configured to provide the second signal from clock input 612a to clock output 617a. Power converter 608a is configured to provide the second signal from clock output 617a to phase shifter 618b. Phase shifter 618b is configured to provide a third signal having the common frequency and a third phase to clock input 612b. Power converter 608b is configured to provide the third signal from clock input 612b to clock output 617b. Power converter 608b is configured to provide the third signal from clock output 617b to phase shifter 618c. Phase shifter 618c is configured to provide a fourth signal having the common frequency and a fourth phase to clock input 612c, and so on.

Power converter 608a is further configured to provide a fifth signal having the common frequency and the second phase from switching output 616a to inductor 620a. Power converter 608b is further configured to provide a sixth signal having the common frequency and the third phase from switching output 616b to inductor 620b. Power converter 608c is further configured to provide a seventh signal having the common frequency and the fourth phase from switching output 616c to inductor 620c, and so on.

In some examples, the signals provided from the switching outputs to the respective inductors have different magnitudes than the signals provided from the clock outputs to the subsequent phase shifters. For example, the second signal, which has the common frequency and the second phase, and which is provided from clock output 617a to phase shifter 618b, may have a different magnitude than the fifth signal, which has the common frequency and the second phase, and which is provided from switching output 616a to inductor 620a.

By having a separate clock output for outputting the clock signal of the respective power converter, each clock signal may be less noisy (e.g., each clock signal may be devoid of noise present at respective switching outputs), which may improve a performance of the circuit. Further, by having a separate clock output, the power converters may operate in a discontinuous operation mode without affecting the clock signal being provided to the subsequent converter. Furthermore, by having a separate clock output, any fault or failure that occurs at a switching output may not affect the clock signal that is output to the subsequent converter, which may result in an improved performance and/or reliability of the circuit.

In some examples, phase shifter 618a and power converter 608a are included in a first package 606a; phase shifter 618b and power converter 608b are included in a second package 606b; and so on. In some examples (not shown), package 506a of FIG. 5A, package 606b of FIG. 6A, and package 506c of FIG. 5A are coupled together to form a hybrid circuit (e.g., a circuit that includes a mixture of packages like those of FIG. 5A and those of FIG. 6A). Other combinations are also feasible.

Figure 6B:
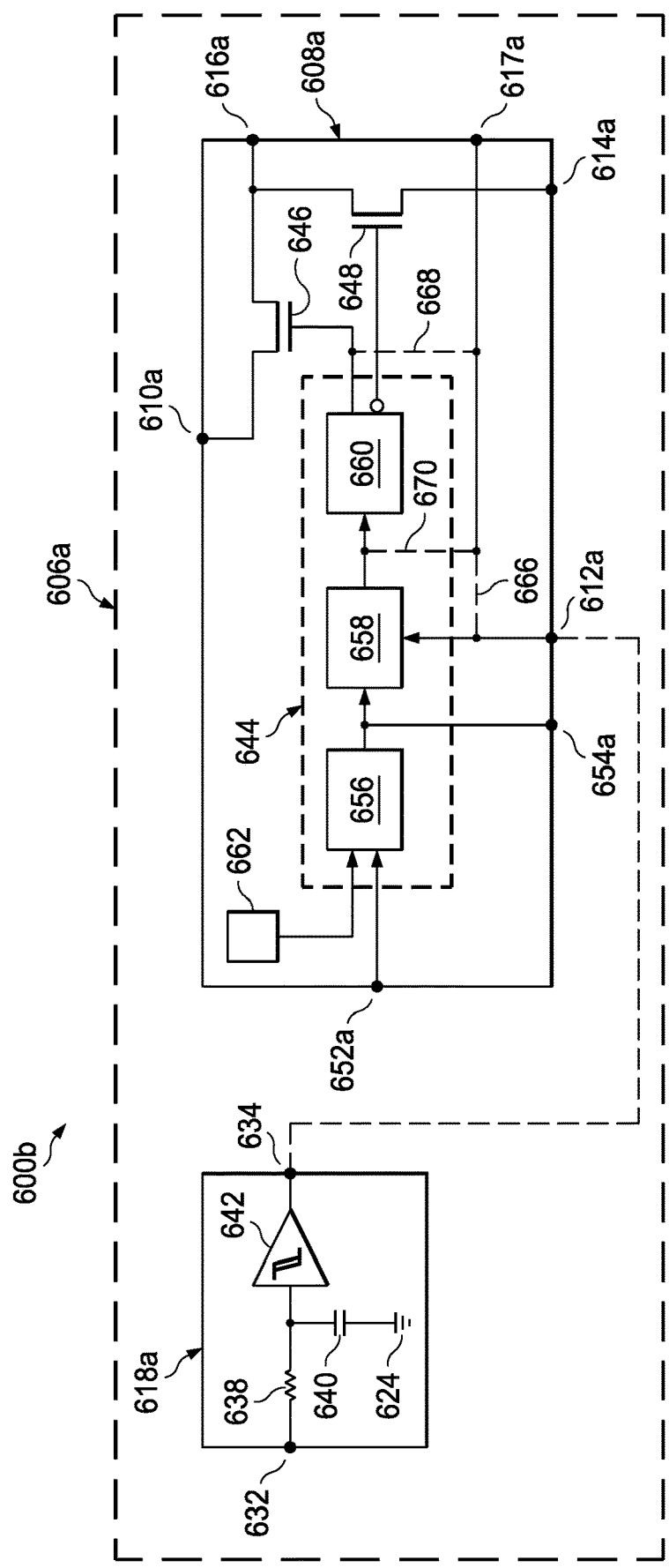
FIG. 6B illustrates a circuit showing an example implementation of a package including a phase shifter and a power converter of FIG. 6A.

FIG. 6B illustrates a circuit 600b showing an example implementation of a package 606a including phase shifter 618a and power converter 608a of FIG. 6A. Each package 606a-606n may be similarly implemented.

Similar to phase shifter 518a of FIG. 5B, phase shifter 618a of FIG. 6B includes a phase shifter input 632, a resistor 638, a capacitor 640, a comparator 642, a phase shifter output 634, and an electrical ground 624 that are coupled as shown. Similar to power converter 508a of FIG. 5B, power converter 608a of FIG. 6B includes a first clock input 612a, a first voltage input 610a, a first switching output 616a, a first ground terminal 614a, a first transistor 646, a second transistor 648, a first feedback input 652a, a first compensation terminal 654a, switch control circuitry 644, and internal reference voltage source 662 that are coupled as shown. Similar to the switch control circuitry 544 of FIG. 5B, the switch control circuitry 644 of FIG. 6B includes an error amplifier 656, a modulator 658, and a control terminal driver 660 that are coupled as shown. Power converter 608a further includes clock output 617a that is coupled as shown.

In some examples, clock output 617a is coupled to clock input 612a (e.g., as shown by a first connection 666). In some alternative examples, clock output 617a is coupled to an output of the control terminal driver 660 (e.g., as shown by a second connection 668). In some other alternative examples, clock output 617a is coupled to an output of the modulator 658 (e.g., as shown by a third connection 670).

FIG. 7 is a flow diagram of some examples of a method 700 for operating a multiphase regulator including a plurality of power converters. Circuit 100a of FIG. 1A or circuit 500a of FIG. 5A may be configured to perform the method 700.

At block 702, method 700 includes providing an input voltage from a voltage input terminal of a circuit to a first voltage input of a first power converter and to a second voltage input of a second power converter. In some examples, the voltage input terminal is coupled to a voltage source. In some examples, the circuits of FIGS. 1A and 5A are configured to perform the function indicated at block 702.

At block 704, method 700 includes providing a first signal having a common frequency and a first phase to a first clock input of the first power converter. In some examples, the first signal is provided to the first clock input from a first phase shifter (e.g., 118a of FIG. 1A). In some other examples, the first signal is alternatively generated by an internal oscillator of the first power converter. In some examples, the circuits of FIGS. 1A and 5A are configured to perform the function indicated at block 704.

At block 706, method 700 includes providing a second signal from a first switching output of the first power converter to an inductor that is coupled between the first switching output and a voltage output terminal of the circuit, the second signal having the common frequency and the first phase. In some examples, a load (e.g., 126 of FIG. 1A) is coupled to the voltage output terminal. In some examples, the circuits of FIGS. 1A and 5A are configured to perform the function indicated at block 706.

At block 708, method 700 includes providing the second signal having the common frequency and the first phase from the first switching output of the first power converter to a phase shifter. In some examples, the phase shifter is referred to as a second phase shifter (e.g., 118b of FIG. 1A). In some examples, the circuits of FIGS. 1A and 5A are configured to perform the function indicated at block 708.

At block 710, method 700 includes providing a third signal from the phase shifter to a second clock input of the second power converter. The third signal has the common frequency and a second phase different from the first phase. In some examples, the circuits of FIGS. 1A and 5A are configured to perform the function indicated at block 710.

In some examples, a fourth signal having the common frequency and the second phase is then provided from a second switching output (e.g., 116b of FIG. 1A) to a third phase shifter (e.g., 118c of FIG. 1A), and a fifth signal having the common frequency and a third phase, different from the first phase and the second phase, is then provided from the third phase shifter to a third clock input of a third power converter.

FIG. 8 is a flow diagram of some alternative examples of a method 800 for operating a multiphase regulator including a plurality of power converters. Circuit 100a of FIG. 1A or circuit 600a of FIG. 6A may be configured to perform the method 800.

At block 802, method 800 includes providing an input voltage from a voltage input terminal of a circuit to a first voltage input of a first power converter and to a second voltage input of a second power converter. In some examples, the voltage input terminal is coupled to a voltage source. In some examples, the circuits of FIGS. 1A and 6A are configured to perform the function indicated at block 802.

At block 804, method 800 includes providing a first signal having a common frequency and a first phase to a first clock input of the first power converter. In some examples, the first signal is provided to the first clock input from a first phase shifter (e.g., 618a of FIG. 6A). In some other examples, the first signal is alternatively generated by an internal oscillator of the first power converter. In some examples, the circuits of FIGS. 1A and 6A are configured to perform the function indicated at block 804.

At block 806, method 800 includes providing a second signal from a first switching output of the first power converter to an inductor that is coupled between the first switching output and a voltage output terminal of the circuit. The second signal has the common frequency and the first phase. In some examples, a load (e.g., 626 of FIG. 6A) is coupled to the voltage output terminal. In some examples, the circuits of FIGS. 1A and 6A are configured to perform the function indicated at block 806.

At block 808, method 800 includes providing the first signal having the common frequency and the first phase from a first clock output of the first power converter to a phase shifter. The first clock output (e.g., 617a of FIG. 6A) is separate from the first switching output. In some examples, the phase shifter is referred to as a second phase shifter (e.g., 618b of FIG. 6A). In some examples, the circuits of FIGS. 1A and 6A are configured to perform the function indicated at block 808.

At block 810, method 800 includes providing a third signal from the phase shifter to a second clock input of the second power converter. The third signal has the common frequency and a second phase different from the first phase. In some examples, the circuits of FIGS. 1A and 6A are configured to perform the function indicated at block 810.

In some examples, the third signal having the common frequency and the second phase is then provided from a second clock output (e.g., 617b of FIG. 6A) to a third phase shifter (e.g., 618c of FIG. 6A), and a fourth signal having the common frequency and a third phase, different from the first phase and the second phase, is then provided from the third phase shifter to a third clock input of a third power converter.

The methods are illustrated and described above as a series of acts or functions, but the illustrated ordering of such acts or functions is not limiting. For example, some acts or function may occur in different orders and/or concurrently with other acts or functions apart from those illustrated and/or described herein. Also, some illustrated acts or functions are optional to implement one or more aspects or examples of this description. Further, one or more of the acts or functions depicted herein may be performed in one or more separate acts, functions, and/or phases. In some examples, the methods described above may be implemented in a computer readable medium using instructions stored in a memory.

In this description, the term "couple" may cover direct or indirect connections, communications or signal paths that enable a functional relationship consistent with this description. Accordingly, if device A generates a signal to control device B to perform a function, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

Modifications are possible in the described examples, and other implementations are possible, within the scope of the claims.

What is claimed is:

1. A circuit comprising:
   a first power converter having a first voltage input and a first switching output;

a second power converter having a second voltage input, a clock input, and a second switching output, wherein the second voltage input is coupled to the first voltage input;
a phase shifter coupled between the first switching output and the clock input of the second power converter;
a first inductor having first and second inductor terminals, wherein the first inductor terminal is coupled to the first switching output; and
a second inductor having third and fourth inductor terminals, wherein the third inductor terminal is coupled to the second switching output, and the fourth inductor terminal is coupled to the second inductor terminal.

2. The circuit of claim 1, wherein the phase shifter is configured to receive a first signal having a frequency and a first phase and provide a second signal at the clock input having the frequency and a second phase that is shifted from the first phase by 140 degrees.

3. The circuit of claim 1, wherein the phase shifter includes:
a resistor having first and second resistor terminals, wherein the first resistor terminal is coupled to the first switching output;
a capacitor having first and second capacitor terminals, wherein the first capacitor terminal is coupled to the second resistor terminal; and
a comparator having a comparator input and a comparator output, wherein the comparator input is coupled to the second resistor terminal and the first capacitor terminal, and the comparator output is coupled to the clock input.

4. The circuit of claim 3, wherein the second power converter includes:
switch control circuitry having a switch control output and a switch control input, wherein the switch control input corresponds to the clock input;
a first transistor having first and second transistor terminals and a first control terminal, wherein the first control terminal is coupled to the switch control output, and the first transistor terminal is coupled to the second voltage input; and
a second transistor having third and fourth transistor terminals and a second control terminal, wherein the second control terminal is coupled to the switch control output, the third transistor terminal is coupled to a ground terminal, and the fourth transistor terminal is coupled to the second transistor terminal.

5. The circuit of claim 1, wherein the clock input is a second clock input, the first power converter has a first clock input, and the phase shifter is a second phase shifter, the circuit further comprising a first phase shifter coupled to the first clock input.

6. The circuit of claim 5, wherein:
the first phase shifter is configured to receive a first signal having a frequency and a first phase and provide a first clock signal at the first clock input having the frequency and a second phase that is shifted from the first phase by 135 to 145 degrees; and
the second phase shifter is configured to receive an output signal having the frequency and the second phase and provide a second clock signal at the second clock input having the frequency and a third phase that is shifted from the second phase by 135 to 145 degrees.

7. The circuit of claim 6 further comprising:
an oscillator coupled to the first phase shifter, the oscillator configured to provide the first signal having the frequency and the first phase to the first phase shifter.

8. The circuit of claim 1, wherein the phase shifter is a first phase shifter, the circuit further comprising:
a third power converter having a third voltage input, a third clock input and a third output, wherein the third voltage input is coupled to the first voltage input; and
a second phase shifter coupled between the second switching output and the third clock input.

9. A circuit comprising:
a first power converter having a first voltage input, a first output, and a first feedback input, wherein the first feedback input is coupled to the first output;
a first inductor having a first inductor terminal and a second inductor terminal, wherein the first inductor terminal is coupled to the first output;
a second power converter having a second voltage input, a clock input, a second feedback input and a second output, wherein the second voltage input is coupled to the first voltage input, and the second feedback input is coupled to the first output;
a second inductor having a third inductor terminal and a fourth inductor terminal, wherein the third inductor terminal is coupled to the second output, and the fourth inductor terminal is coupled to the second inductor terminal; and
a phase shifter coupled between the first output and the clock input of the second power converter.

10. The circuit of claim 9 further comprising:
an input capacitor having first and second capacitor terminals, wherein the first capacitor terminal is coupled to the first voltage input and the second voltage input, and the second capacitor terminal is coupled to a ground terminal; and
an output capacitor having third and fourth capacitor terminals, wherein the third capacitor terminal is coupled to the second inductor terminal, and the fourth capacitor terminal is coupled to the ground terminal.

11. The circuit of claim 9, wherein the first power converter includes:
switch control circuitry having first and second switch control inputs and a switch control output, wherein the first switch control input is coupled to an internal reference voltage terminal, and the second switch control input corresponds to the clock input;
a first transistor having a first control terminal and first and second transistor terminals, wherein the first control terminal is coupled to the switch control output, the first transistor terminal is coupled to the second voltage input, and the second transistor terminal is coupled to the first output; and
a second transistor having a second control terminal and third and fourth transistor terminals, wherein the second control terminal is coupled to the switch control output, the third transistor terminal is coupled to a ground terminal, and the fourth transistor terminal is coupled to the first output.

12. The circuit of claim 9, wherein the phase shifter is a first phase shifter, the circuit further comprising:
a third power converter having a third voltage input, a third clock input and a third output, wherein the third voltage input is coupled to the first voltage input; and
a second phase shifter coupled between the second output of the second power converter and the third clock input.

13. The circuit of claim 12 further comprising:
a third inductor having fifth and sixth inductor terminals, wherein the fifth inductor terminal is coupled to the third output, and the sixth inductor terminal is coupled to the second inductor terminal and the fourth inductor terminal.

14. A circuit comprising:
a first power converter having a first feedback input, a first voltage input, a first switching output, a first clock output, wherein the first feedback input is coupled to the first switching output;
a first inductor having a first inductor terminal and a second inductor terminal, wherein the first inductor terminal is coupled to the first switching output;
a second power converter having a second voltage input, a clock input, a second switching output and a second feedback input, wherein the second voltage input is coupled to the first voltage input, and the second feedback input is coupled to the first clock output;
a second inductor having a third inductor terminal and a fourth inductor terminal, wherein the third inductor terminal is coupled to the second switching output, and the fourth inductor terminal is coupled to the second inductor terminal; and
a phase shifter coupled between the first clock output and the clock input of the second power converter.

15. The circuit of claim 14 further comprising:
an input capacitor having first and second capacitor terminals, wherein the first capacitor terminal is coupled to the first voltage input and the second voltage input, and the second capacitor terminal is coupled to a ground terminal.

16. The circuit of claim 14 further comprising:
an output capacitor having third and fourth capacitor terminals, wherein the third capacitor terminal is coupled to the second inductor terminal, and the fourth capacitor terminal is coupled to a ground terminal.

17. The circuit of claim 14, wherein the first power converter includes:
switch control circuitry having first and second switch control inputs and a switch control output, wherein the first switch control input is coupled to an internal reference voltage terminal, and the second switch control input corresponds to the clock input;
a first transistor having a first control terminal and first and second transistor terminals, wherein the first control terminal is coupled to the switch control output, the first transistor terminal is coupled to the second voltage input, and the second transistor terminal is coupled to the first switching output; and
a second transistor having a second control terminal and third and fourth transistor terminals, wherein the second control terminal is coupled to the switch control output, the third transistor terminal coupled to a ground terminal, and the fourth transistor terminal is coupled to the first switching output.

18. The circuit of claim 17, wherein the switch control circuitry includes:
an error amplifier having a first input, a second input, and an output, wherein the first input is coupled to the internal reference voltage terminal, and the second input is coupled to the clock input;
a modulator having a modulator input and a modulator output, wherein the modulator input is coupled to the error amplifier; and
a control terminal driver having a driver input and a driver output, wherein the driver input is coupled to the modulator output, and the modulator output corresponds to the switch control output.

* * * * *